US012622215B2

(12) United States Patent
Li et al.

(10) Patent No.: US 12,622,215 B2
(45) Date of Patent: May 5, 2026

(54) TURNTABLE FOR WAFER TRANSPORT SYSTEM

(71) Applicant: Taiwan Semiconductor Manufacturing Company, Ltd., Hsinchu (TW)

(72) Inventors: Guancyun Li, Miaoli County (TW); Ching-Jung Chang, Taichung (TW); Chi-Feng Tung, Miaoli County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 876 days.

(21) Appl. No.: 17/896,374

(22) Filed: Aug. 26, 2022

(65) Prior Publication Data

US 2024/0071797 A1     Feb. 29, 2024

(51) Int. Cl.
    H01L 21/677        (2006.01)
    H01L 21/67         (2006.01)
(52) U.S. Cl.
    CPC .. H01L 21/67715 (2013.01); H01L 21/67259 (2013.01); H01L 21/67706 (2013.01); H01L 21/67724 (2013.01); H01L 21/67727 (2013.01); H01L 21/6773 (2013.01); H01L 21/67733 (2013.01)
(58) Field of Classification Search
    CPC .......... E01B 25/22; E01B 25/24; E01B 25/26; B61J 1/00; B61J 1/06; B61J 1/10; H01L 21/677; H01L 21/67703; H01L 21/67715; H01L 21/67724; H01L 21/67727; H01L 21/6773; H01L 21/67733; B65G 9/008

USPC ........................... 104/35, 36, 38, 89, 96, 99
See application file for complete search history.

(56) References Cited

U.S. PATENT DOCUMENTS

| | | | | | |
|---|---|---|---|---|---|
| 582,436 | A | * | 5/1897 | Ridgway | B65G 9/008 104/99 |
| 6,109,405 | A | * | 8/2000 | Odachi | B61L 3/18 191/10 |
| 6,990,721 | B2 | * | 1/2006 | Mariano | H01L 21/67727 414/940 |
| 9,852,934 | B2 | | 12/2017 | Hsieh et al. | |
| 10,262,882 | B2 | | 4/2019 | Hsieh et al. | |
| 2009/0288931 | A1 | * | 11/2009 | Oshima | H01L 21/67706 198/607 |

(Continued)

FOREIGN PATENT DOCUMENTS

WO      WO-2019052594 A1 *   3/2019   .............. E21F 13/02

*Primary Examiner* — S. Joseph Morano
*Assistant Examiner* — Heaven R Buffington
(74) *Attorney, Agent, or Firm* — HAYNES AND BOONE, LLP

(57) ABSTRACT

A system according to the present disclosure includes a first fixed rail segment, a second fixed rail segment aligned with the first fixed rail segment along a first direction, a rotatable rail joint disposed between the first fixed rail segment and the second fixed rail segment along the first direction, a hanger mechanically coupled to the rotatable rail joint, a powered rotational mechanism housed in the hanger. The rotatable rail joint includes at least one rotational rail that is aligned with the first fixed rail segment and the second fixed rail segment when the rotatable rail joint rotates to an alignment position is not aligned with the first fixed rail segment and the second fixed rail segment when the rotatable rail joint rotates out of the alignment position.

20 Claims, 14 Drawing Sheets

(56)  References Cited

U.S. PATENT DOCUMENTS

| | | |
|---|---|---|
| 2010/0138016 A1 | 6/2010 | Chen et al. |
| 2017/0128313 A1* | 5/2017 | Glukhovsky ............ B60M 1/32 |

* cited by examiner

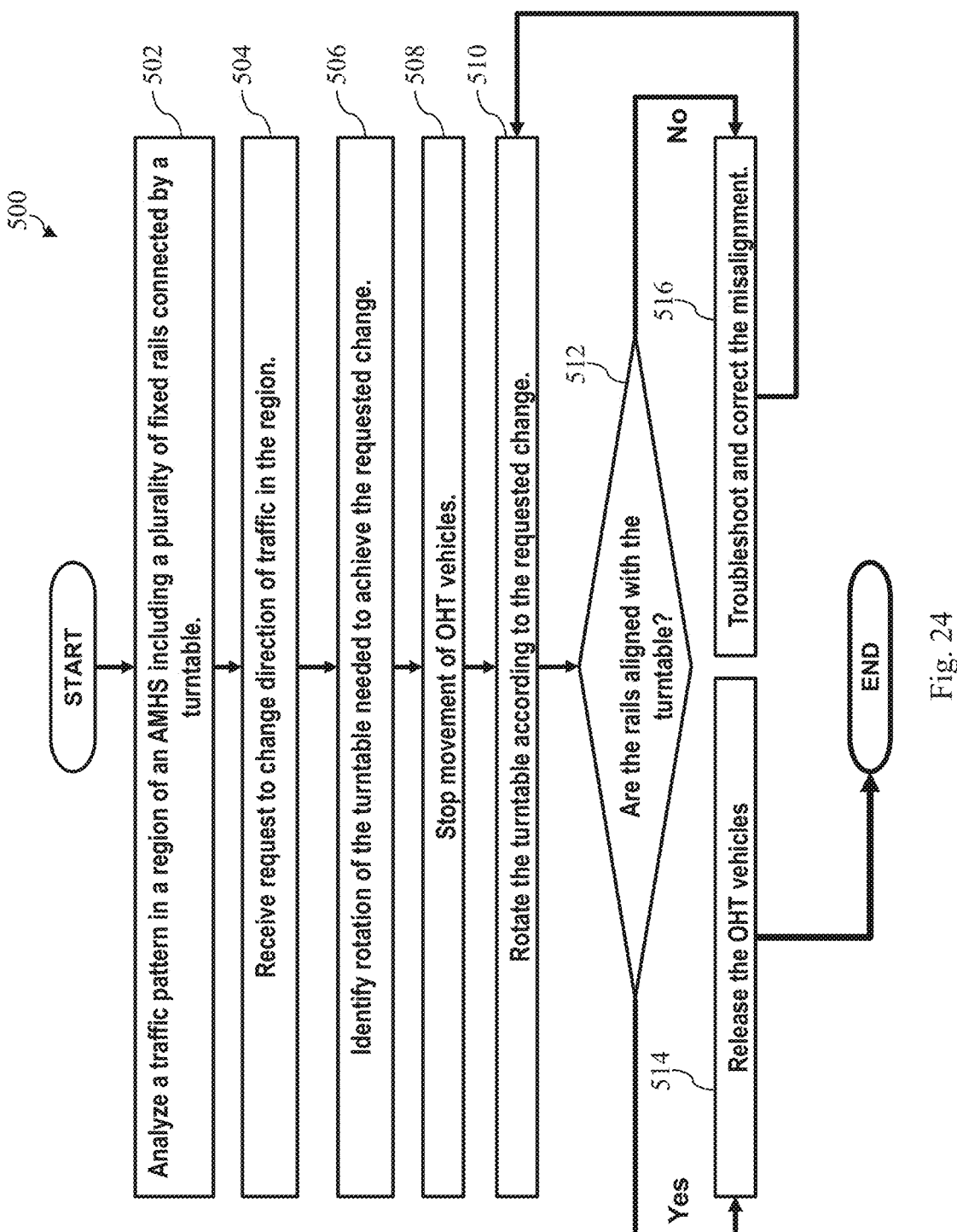

500

START

502 — Analyze a traffic pattern in a region of an AMHS including a plurality of fixed rails connected by a turntable.

504 — Receive request to change direction of traffic in the region.

506 — Identify rotation of the turntable needed to achieve the requested change.

508 — Stop movement of OHT vehicles.

510 — Rotate the turntable according to the requested change.

512 — Are the rails aligned with the turntable?

514 — Yes — Release the OHT vehicles

516 — No — Troubleshoot and correct the misalignment.

END

Fig. 24

TURNTABLE FOR WAFER TRANSPORT SYSTEM

BACKGROUND

The manufacture of semiconductor devices involves the performance of a series of process steps using a variety of high-tech production and metrology tools in a certain order and often within a certain period of time. The primary function of a wafer logistics system in a wafer fabrication facility, or "fab," is to deliver the wafers to each of the tools at the right time, as well as to track the location and status of the wafers throughout the process. Automated material handling systems ("AMHS") are implemented to wafer fabs to carry out the automated functions more efficiently, consistently, and safely than can be done via manual means.

An AMHS includes an overhead transport ("OHT") system that includes rails that are mounted to the ceiling of a fab floor. OHT vehicles can travel along the rails to transport wafers among different loading ports of different tools. Because the rails of the OHT system are fixed, the routes and travel directions of OHT vehicles are also fixed unless they can transfer to a different rail. Therefore, although existing OHT systems have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 24 is a flowchart of a method for using turntables of the present disclosure.

DETAILED DESCRIPTION

Figure 1:
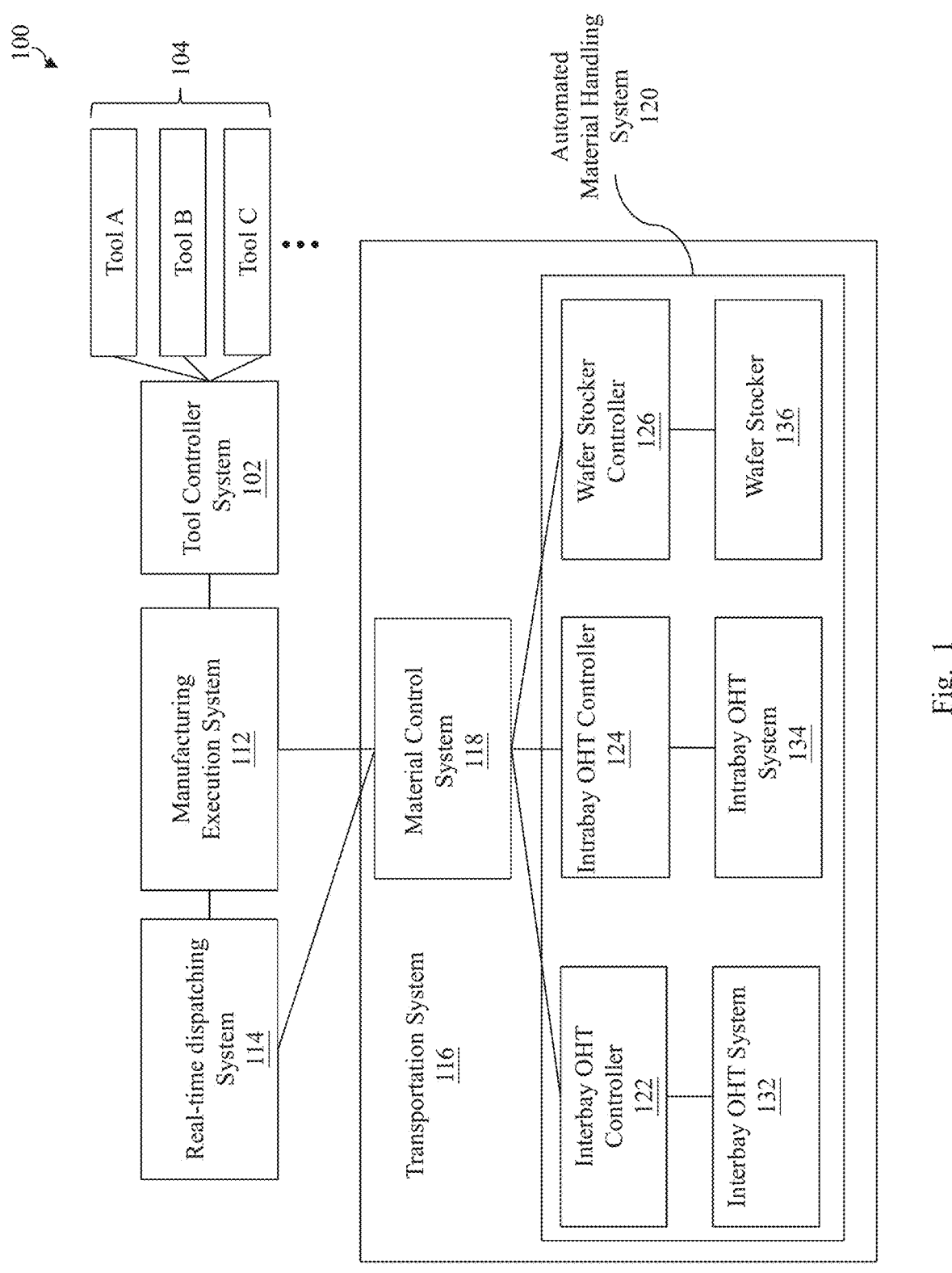
FIG. 1 is a block diagram illustrating an exemplary factory automation system, according to one or more aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Specific examples of components and arrangements are described below to simplify and thus clarify the present disclosure. These are, of course, merely examples and are not intended to be limiting. In many instances, the features of one embodiment may be combined with the features of other embodiments. In addition, the present disclosure may repeat reference numerals and/or letters in the various exemplary embodiments. This repetition is for the purpose of simplicity and clarity and does not in itself dictate a relationship between the various embodiments and/or configurations discussed.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

A semiconductor foundry may include a number of fabs. During fabrication, a wafer may be transferred within a fab across vast distance. The transport of wafers in a fab is usually carried out by an AMHS. In general, an AMHS is any computer controlled system in a fab that moves wafers (or workpieces) between workstations (or process tools) or between workstations and storage locations. When being transported, wafers (or workpieces) are placed in a wafer carrier (e.g., a front opening unified pod "FOUP") and the wafer carrier is carried by a vehicle that is guided by the AMHS. In some examples, the vehicle is part of an OHT system that includes a network of rails. The vehicles travel and stop along the rails to pick up and deliver the wafers (or workpieces). In some existing technology, a rail plan is designed based on the fab layout design such that the vehicle can travel over and dock directly above loading ports of the processing tools. Once the rail plan is determined, rails and their supporting structures, such as hangers and raceways, are installed to ceiling locations to execute the rail plan. Once the rails are installed, they are fixed in position and the routes and travel directions of OHT vehicles are also fixed unless they can transfer to a different rail.

FIG. 1 is a block diagram of an exemplary factory automation system 100 that may be implemented in a fab. The factory automation system 100 includes a tool controller system ("TCS") 102 with a controller for each respective tool 104, a manufacturing execution system ("MES") 112, a real-time dispatching system ("RTD") 114, and a transportation system 116. The transportation system 116 includes a material control system ("MCS") 118 and an automated material handling system ("AMHS") 120. The AMHS 120 includes a plurality of control modules, such as an interbay OHT controller 122 that controls an interbay OHT system 132, an intrabay OHT controller 124 that controls an intrabay OHT system 134, a wafer stocker controller ("WSC") 126 that controls a wafer stocker 136. The AMHS 120 can include additional, fewer, and different control modules in other embodiments.

As shown in FIG. 1, the TCS 102 is in communication with the IVIES 112. The MES 112, the RTD 114, and the transportation system 116 (including the MCS 118 and AMHS 120) are in communication with one another. The communication between the TCS 102, the IVIES 112, the RTD 114, and the transportation system 116 may be accomplished through any suitable method including wired and wireless connections, including but not limited to computer network and telecommunications networks. The TCS 102 is adapted to send a wafer carrier delivery request to the MES 112. Responsive to the delivery request, the MES 112 determines the appropriate destination and generates a transfer request to move a wafer carrier between locations in the fab. Utilizing data available from the IVIES 112 and the transportation system 116, the RTD 114 determines an appropriate route for the wafer carrier based on a set of RTD rules. The RTD 114 selects between multiple paths, when there is more than one possible path to the same destination. RTD 114 may send multiple micro commands (MMCs) defining the appropriate transfer path to the transportation system 116 for execution. The RTD rules are used to determine the appropriate order of execution and appropriate routes for transferring wafer carriers between locations within the fab.

Figure 2:
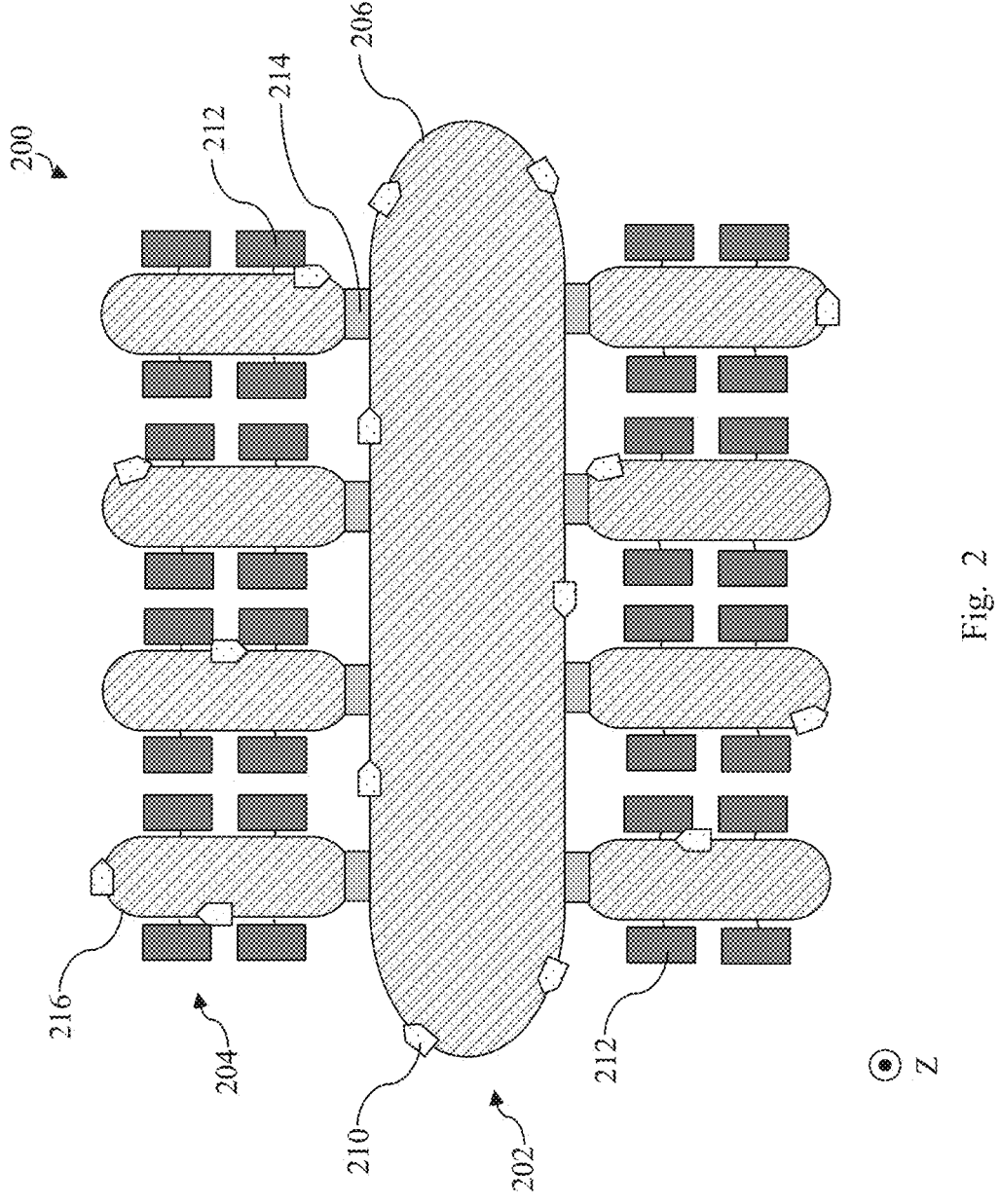
FIG. 2 is a schematic diagram illustrating an example rail plan in a fab, according to one or more aspects of the present disclosure.

FIG. 2 is a schematic diagram illustrating an example fab layout 200, according to one or more aspects of the present disclosure. The fab layout 200 includes a center aisle 202 and a plurality of process bays 204. Each of the process bays 204 may include one or more process tools 212, which may correspond to Tools A, B, and C in FIG. 1. In some implementations, each of the process bays 204 includes a wafer stocker 214 adjacent the center aisle 202. The stockers 214 may correspond to the wafer stocker 136 in FIG. 1, which is controlled by the wafer stocker controller 126. Each of the wafer stockers 214 is configured to hold multiple standard mechanical interface (SMIF) pods or front opening unified pods (FOUPs). Each of the SMIF pods and the FOUPs can carry multiple wafers. The center aisle 202 includes an interbay rail 206 that is capable to move wafers among different process bays 204. Each of the process bays 204 includes an intrabay rail 216. Each of the intrabay rails 216 provides wafer transport within the process bay 204. The interbay rail 206 may be a part of the interbay OHT system 132 in FIG. 1. The intrabay rail 216 may be a part of the intrabay OHT system 134 in FIG. 1. A plurality of OHT vehicles 210 are configured to move along the interbay rail 206 or the intrabay rail 216. Each of the OHT vehicles 210 is configured to carry multiple SMIF pods or FOUPs. As shown in FIG. 2, while there may be multiple interbay rails 206 and multiple intrabay rails 216, OHT vehicles 210 may not transfer to a different track or make a U-turn unless it reaches a node or a transport mechanism. This limits how the RTD 114 determines routes.

The present disclosure provides turntables for an OHT system. The turntable includes at least one non-stationary rail that can rotate with the turntable to align with different fixed rail segments. By rotating in and out of alignment with different fixed rail segments, the turntable may serve as a track changer to transfer an OHT vehicle from one track to another track, a return track to help an OHT vehicle to make a U-turn to a different track, or a passing bay to allow an OHT vehicle to pass another OHT vehicle. A turntable of the present disclosure is rotatably installed to the ceiling of a fab and has a power source independent from that of the fixed rail segments. The turntable and the fixed rail segments include position sensors to ensure that non-stationary rail on the turntable is aligned with fixed rail segments.

Figures 3, 4:
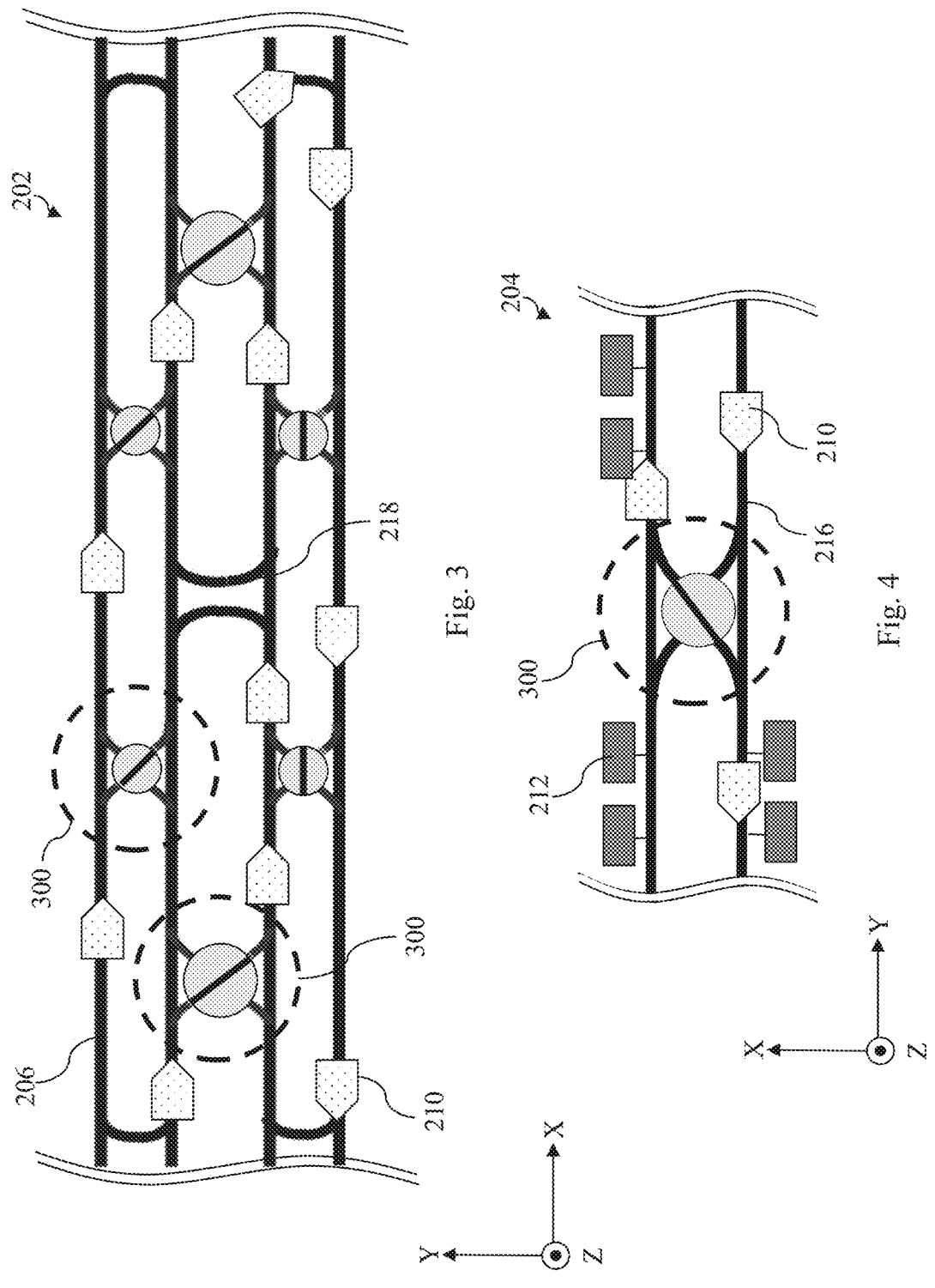
FIG. 3 is a schematic top view of an interbay rail segment where turntables are implemented, according to one or more aspects of the present disclosure.
FIG. 4 is a schematic top view of an intrabay rail segment where turntables are implemented, according to one or more aspects of the present disclosure.

Reference is now made to FIG. 3, which illustrates an interbay rail segment in the center aisle 202. The interbay rail segment shown in FIG. 3 includes four interbay rails 206 that extend parallel with one another along the X direction. OHT vehicles 210 can travel along the interbay rails 206 along the X direction, either from left to right or from right to left in FIG. 3. The interbay rail segment may also include turnaround rails 218 that allows an OHT vehicle 210 traveling along the X direction from left to right to turn around onto another rail to travel along the X direction from right to left. That is, while the turnaround rails 218 allow OHT vehicles 210 to change to a diagonal direction, their traveling directions are reversed. In other words, an OHT vehicle 210 can only use a turnaround rail 218 when the two interbay rails 206 have different traveling directions. In some embodiments, the interbay rail segment includes a plurality of first turntables 300. As will be described in more detail further below, each of the first turntables 300 is rotatable around the Z direction on the X-Y plane. Each of the first turntables 300 includes at least one non-stationary rail (only one is shown in FIG. 3) that can rotate into and out of alignment with joining rails. The first turntables 300 allow OHT vehicles 210 travelling in one direction to transfer to an adjacent rail while maintaining the direction of travel. The first turntable 300 may be referred to as a rail joint or a rotatable rail joint.

The first turntables 300 of the present disclosure may be implemented to intrabay rails. Reference is now made to FIG. 4, which illustrates an intrabay rail segment in a process bay 204. The intrabay rail segment shown in FIG. 4 includes 2 intrabay rails 216 that extend parallel with each other along the Y direction. OHT vehicles 210 can travel along the intrabay rails 216 along the Y direction, either from left to right or from right to left in FIG. 4. In some embodiments, the interbay rail segment includes a plurality of first turntables 300. As will be described in more detail further below, each of the first turntables 300 is rotatable around the Z direction on the X-Y plane. Each of the first turntables 300 includes at least one non-stationary rail (only one is shown in FIG. 4) that can rotate into and out of alignment with joining rails. The first turntables 300 allow OHT vehicles 210 travelling in one direction to transfer to an adjacent rail while maintaining the direction of travel. As illustrated in FIG. 4, by allowing the OHT vehicles 210 to transfer to an adjacent intrabay rail 216, the first turntables 300 provide the intrabay OHT system more flexibility to reach to different process tools 212 in the process bay 204.

Figure 5:
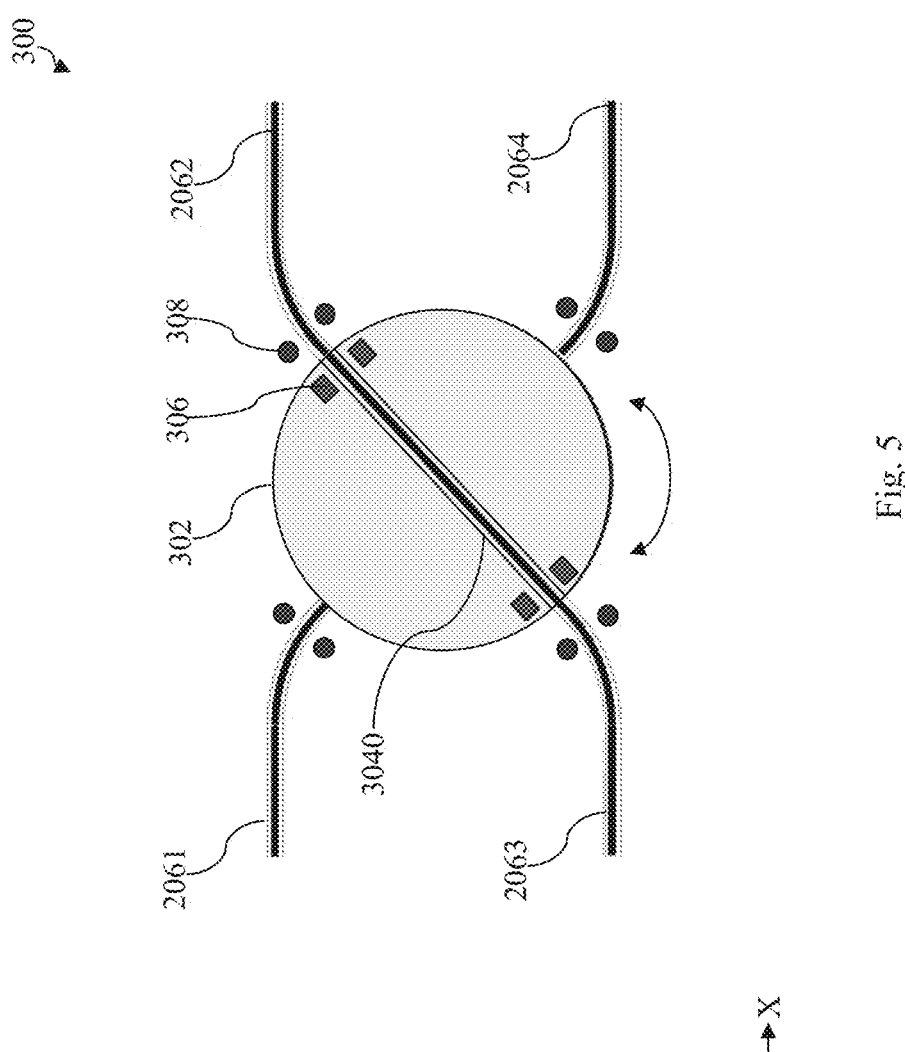
FIG. 5 is a schematic top view of a first type turntable, according to one or more aspects of the present disclosure.

FIG. 5 schematically illustrates a top view of a first turntable 300 implemented to interbay rails 206. In some embodiments represented in FIG. 5, the first turntable 300 includes rotatable plate 302 that is circular in shape. The first turntable 300 also includes a first non-stationary rail 3040 that extends straight along a diameter of the circular rotatable plate 302. It is noted that while the first non-stationary rail 3040 is shown in FIG. 5 as unitary, it may include a pair of rail members that extend parallel to one another. When the interbay OHT system or the intrabay OHT system is a monorail system, the first non-stationary rail 3040 may include one rail and the OHT vehicle rides on that rail. When the interbay OHT system or the intrabay OHT system is a dual rail system, the first non-stationary rail 3040 may include two parallel rail members and the OHT vehicle rides on the pair of rail members. The rotatable plate 302 is surrounded by two pairs of aligned interbay rail branches, which include a first interbay rail branch 2061, a second interbay rail branch 2062, a third interbay rail branch 2063, and a fourth interbay rail branch 2064. The first interbay rail branch 2061 is aligned with the fourth interbay rail branch 2064. The third interbay rail branch 2063 is aligned with the second interbay rail branch 2062. The rotatable plate 302 is rotatable between at least two positions. In a first position, the rotatable plate 302 rotates such that the first non-stationary rail 3040 is aligned with the first interbay rail branch 2061 and the fourth interbay rail branch 2064. In a second position, the rotatable plate 302 rotates such that the first non-stationary rail 3040 is aligned with the third interbay rail branch 2063 and the second interbay rail branch 2062. As will be described further below, the rotatable plate 302 may also rotate out of alignment with all four interbay rail ranches. Because the first non-stationary rail 3040 is attached to the rotatable plate 302, it may also be referred to as a first rotational rail 3040 or a first rotational track 3040.

In some embodiments depicted in FIG. 5, the first turntable 300 also includes position sensors to detect whether the first non-stationary rail 3040 is in alignment with the interbay rail branches. Referring to FIG. 5, non-stationary sensors 306 are mechanically attached to the rotatable plate 302 and stationary sensors 308 are mechanically attached to the interbay rail branches. The non-stationary sensors 306 are adjacent the first non-stationary rail 3040 and the stationary sensors 308 are adjacent to each of the interbay rail branches. Each of the non-stationary sensors 306 is configured to function with a stationary sensor 308. For example, the non-stationary sensor 306 may include an infrared emitter and an infrared receiver while the stationary sensor 308 includes a mirror. Infrared emitted from the infrared emitter may be reflected by the mirror back to the receiver to provide alignment information or confirmation. Alternatively, the non-stationary sensor 306 may include a mirror while the stationary sensor 308 an infrared emitter and an infrared receiver. In another example, the non-stationary sensor 306 may include an infrared emitter while the stationary sensor 308 includes an infrared receiver. Infrared emitted by the non-stationary sensor 306 may be received by the stationary sensor 308 when alignment is reached. Alternatively, the non-stationary sensor 306 may include an infrared receiver while the stationary sensor 308 includes an infrared emitter.

Figure 6:
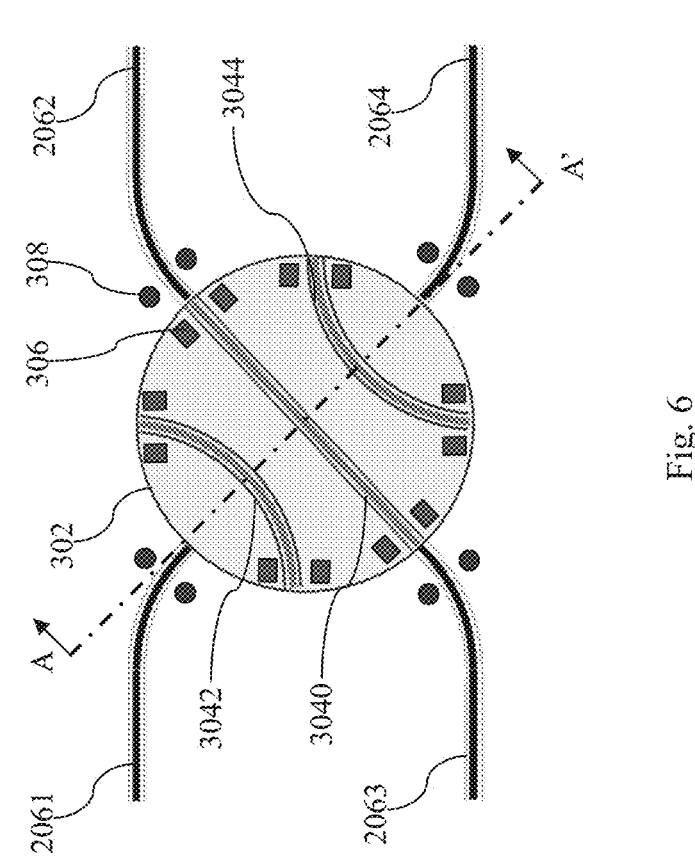
FIG. 6 is a schematic top view of a second type turntable, according to one or more aspects of the present disclosure.

FIG. 6 schematically illustrates a top view of a second turntable 300' implemented to interbay rails 206. In some embodiments represented in FIG. 6, the second turntable

300' includes rotatable plate 302 that is circular in shape. The second turntable 300' also includes a first non-stationary rail 3040 that extends along a diameter of the circular rotatable plate 302. The first non-stationary rail 3040 equally divides the rotatable plate in two halves. The second turntable 300' also includes one curved non-stationary rail in each of the two halves. As shown in FIG. 6, the two curved non-stationary rails include a second non-stationary rail 3042 and a third non-stationary rail 3044. In the depicted embodiment, the second non-stationary rail 3042 and the third non-stationary rail 3044 are mirror images of one another with respect to the first non-stationary rail 3040. It is noted that while each of the two curved non-stationary rails is shown in FIG. 6 as unitary, it may include a pair of rail members that extend parallel to one another. When the interbay OHT system or the intrabay OHT system is a monorail system, the second non-stationary rail 3042 or third non-stationary rail 3044 may include one rail and the OHT vehicle rides on that rail. When the interbay OHT system or the intrabay OHT system is a dual rail system, the second non-stationary rail 3042 or third non-stationary rail 3044 may include two parallel rail members and the OHT vehicle rides on the pair of rail members. The rotatable plate 302 is surrounded by two pairs of aligned interbay rail branches, which include a first interbay rail branch 2061, a second interbay rail branch 2062, a third interbay rail branch 2063, and a fourth interbay rail branch 2064. The first interbay rail branch 2061 is aligned with the fourth interbay rail branch 2064. The third interbay rail branch 2063 is aligned with the second interbay rail branch 2062. The rotatable plate 302 for the second turntable 300' is rotatable between at least three positions. In a first position, the rotatable plate 302 rotates such that the first non-stationary rail 3040 is aligned with the first interbay rail branch 2061 and the fourth interbay rail branch 2064. In a second position, the rotatable plate 302 rotates such that the first non-stationary rail 3040 is aligned with the third interbay rail branch 2063 and the second interbay rail branch 2062. In a third position, one end of the second non-stationary rail 3042 is aligned with the first interbay rail branch 2061 and the other end of the second non-stationary rail 3042 is aligned with the second interbay rail branch 2062. Additionally, one end of the third non-stationary rail 3044 is aligned with the third interbay rail branch 2063 and the other end of the third non-stationary rail 3044 is aligned with the fourth interbay rail branch 2064. As will be described further below, the rotatable plate 302 for the second turntable 300' may also rotate out of alignment with all four interbay rail ranches. Because the second non-stationary rail 3042 and the third non-stationary rail 3044 are attached to the rotatable plate 302, they may also be referred to as a second rotational rail 3042 and a third rotational rail 3044, respectively. Alternatively, the second non-stationary rail 3042 and the third non-stationary rail 3044 may be referred to as a second rotational track 3042 and a third rotational track 3044, respectively.

In some embodiments depicted in FIG. 6, the second turntable 300' also includes position sensors to detect whether one or all of the first non-stationary rail 3040, the second non-stationary rail 3042 and the third non-stationary rail 3044 is in alignment with the interbay rail branches. Referring to FIG. 6, non-stationary sensors 306 are mechanically attached to the rotatable plate 302 and stationary sensors 308 are mechanically attached to the interbay rail branches. The non-stationary sensors 306 for the second turntable 300' are adjacent the first non-stationary rail 3040, the second non-stationary rail 3042 and the third nonstationary rail 3044. The stationary sensors 308 are adjacent to each of the interbay rail branches. Each of the non-stationary sensors 306 is configured to function with a stationary sensor 308. For example, the non-stationary sensor 306 may include an infrared emitter and an infrared receiver while the stationary sensor 308 includes a mirror. Infrared emitted from the infrared emitter may be reflected by the mirror back to the receiver to provide alignment information or confirmation. Alternatively, the non-stationary sensor 306 may include a mirror while the stationary sensor 308 includes an infrared emitter and an infrared receiver. In another example, the non-stationary sensor 306 may include an infrared emitter while the stationary sensor 308 includes an infrared receiver. Infrared emitted by the non-stationary sensor 306 may be received by the stationary sensor 308 when alignment is reached. Alternatively, the non-stationary sensor 306 may include an infrared receiver while the stationary sensor 308 includes an infrared emitter.

Figure 7:
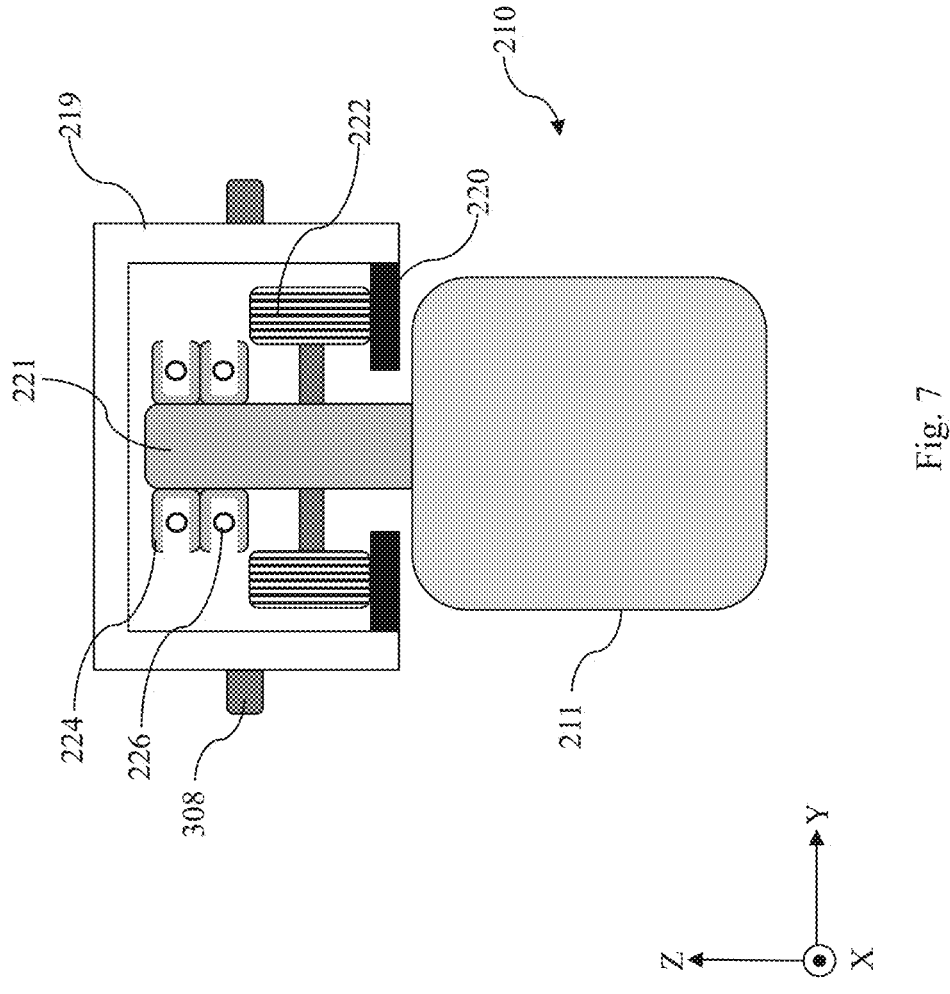
FIG. 7 is a schematic cross-sectional view of an OHT vehicle having position sensors at a first location, according to one or more aspects of the present disclosure.

FIG. 7 is a schematic cross-sectional view of an OHT vehicle 210 riding on an interbay rail 206 or an intrabay rail 216. The OHT vehicle 210 includes a body 211 to carry a plurality of standard mechanical interface (SMIF) pods or front opening unified pods (FOUPs). The OHT vehicle 210 includes a vertical support 221 that is mechanically attached to the body 211. The vertical support 221 includes a motor and a drivetrain to drive two wheels 222. The vertical support 221 may also include a plurality of core blocks 224. In the depicted embodiment, the vertical support 221 includes four (4) core blocks. Each of the core blocks 224 has a U-shape and includes an opening pointing away from the vertical support 221 to engage a power cable 226. In some embodiments illustrated in FIG. 7, legs of two adjacent core blocks 224 is wounded around by a pickup coil 228. Induction current 230 from the pickup coil 228 may power the motor in the vertical support 221. Each of the core blocks 224 is formed of low carbon steel. Each interbay rail 206 or an intrabay rail 216 includes two parallel-extending rail members 220. Each of the two wheels 222 rides on or engages one of rail members 220. The two rail members 220 are mechanically supported by a yoke 219 that substantially surround the wheels 222, the vertical support 221, and the plurality of core blocks 224. In some embodiments represented in FIG. 7, the stationary sensors 308 are affixed to side surfaces of the yoke 219. The stationary sensors 308 are aligned with non-stationary sensors 306 when a non-stationary rail is aligned with a stationary rail. The core blocks 224 and the power cables 226 are a part of an induction power supply system 250 shown in FIG. 8.

Figure 8:
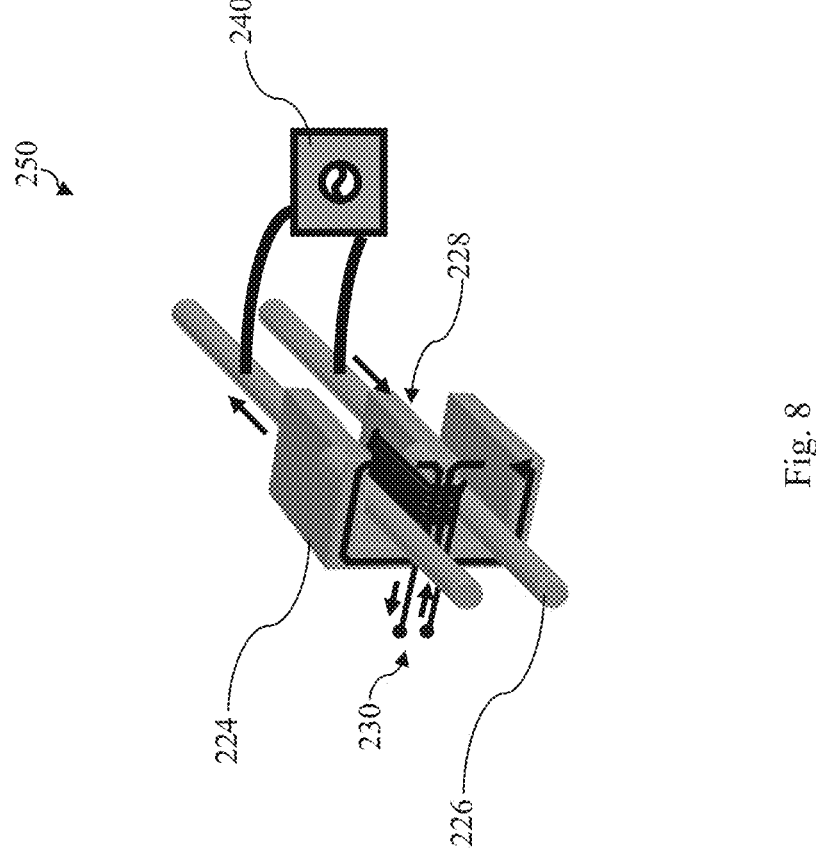
FIG. 8 is a schematic perspective view of an induction power supply system, according to one or more aspects of the present disclosure.

Reference is now made to FIG. 8. The induction power supply system 250 supply power to the OHT vehicle 210 inductively such that the motor in the vertical support 221 drives the wheels 222. As shown in FIG. 8, the power cables 226 may come in pairs that are disposed on over another. A pair of the power cables 226 are coupled to a first power source 240. When the power cables 226 are powered up, the current in the power cables 226 create magnetic flux in the core blocks 224, which provides an induction current 230 to power the motor in the vertical support 221. Each pair of the power cables 226 run a full length of the stationary rail or the non-stationary rail to power the OHT vehicles 210.

Figure 9:
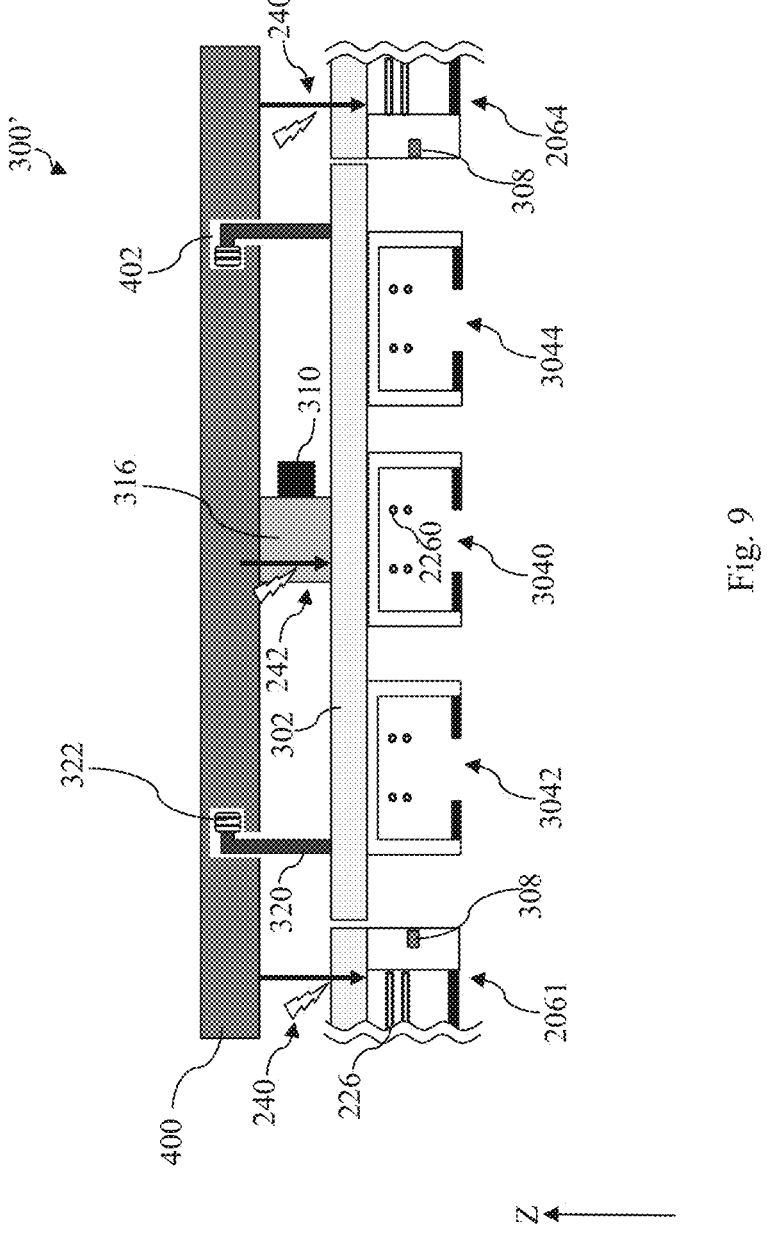
FIG. 9 is a schematic cross-sectional view of a second type turntable having position sensors at a first location, according to one or more aspects of the present disclosure.

FIG. 9 is a schematic cross-sectional view of the second turntable 300' along line A-A' in FIG. 6. As shown in FIG. 6, line A-A' passes through the first interbay rail branch 2061, the second non-stationary rail 3042, the first non-stationary rail 3040, and the third non-stationary rail 3044, the rotatable plate 302, and the fourth interbay rail branch 2064. Referring back to FIG. 9, the rotatable plate 302 is mechanically attached to a ceiling 400 of a fab by way of a hanger 316, which houses a motor 310 that drives a rotational mechanism to rotate the rotatable plate 302 around an axis along the Z direction. The hanger 316 is attached to a top surface of the rotatable plate 302. The first non-stationary rail 3040, the second non-stationary rail 3042 and the third non-stationary rail 3044 are attached to a bottom surface of the rotatable plate 302. The rotational mechanism may rotate the rotatable plate 302 clockwise or counter-clockwise. Because a fully loaded OHT vehicle 210 may weigh hundreds of kilograms, the rotatable plate 302 may also include one or more support members 320. Each of the support members 320 includes a set support wheels 322 to travel in track compartment 402 in the ceiling 400.

The stationary sensors 308 are mechanically attached to the yokes of the first interbay rail branch 2061 and the fourth interbay rail branch 2064 such that they can interact with the non-stationary sensors 306 shown in FIG. 6. As shown in FIG. 9, because the rotatable plate 302 is rotatable, power cables 226 running along the first interbay rail branch 2061 or the fourth interbay rail branch 2064 cannot continue onto the rotatable plate 302. For that reasons, the non-stationary rails 3040, 3042 and 3044 are separately controlled and powered. The first interbay rail branch 2061 or the fourth interbay rail branch 2064 may be powered by power cables 226 while the first non-stationary rail 3040, the second non-stationary rail 3042, and the third non-stationary rail 3044 may be powered by turntable power cables 226. The power cables 226 may draw power from a first power source 240 and the turntable power cables 2260 may draw power from a second power source 242. The first power source 240 may be connected to a first power supply panel and the second power source 242 may be connected to a second power supply panel.

Figure 10:
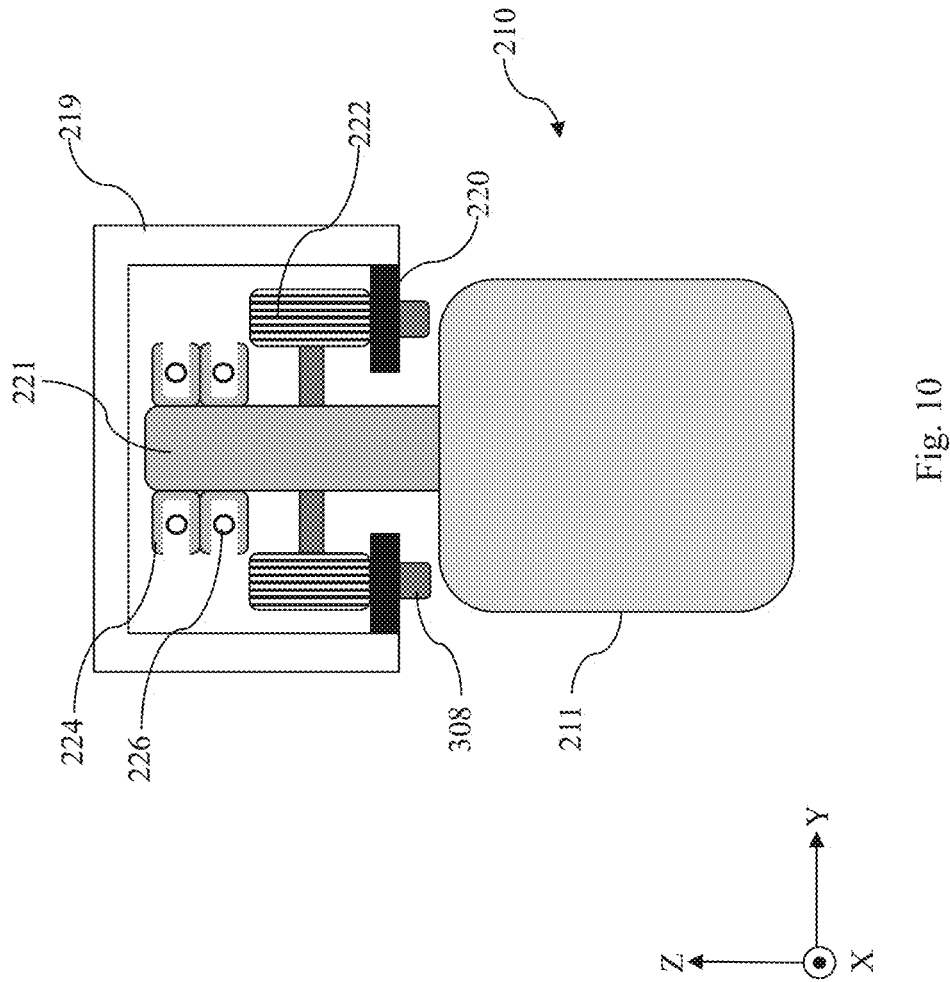
FIG. 10 is a schematic cross-sectional view of an OHT vehicle having position sensors at a second location, according to one or more aspects of the present disclosure.
Figure 11:
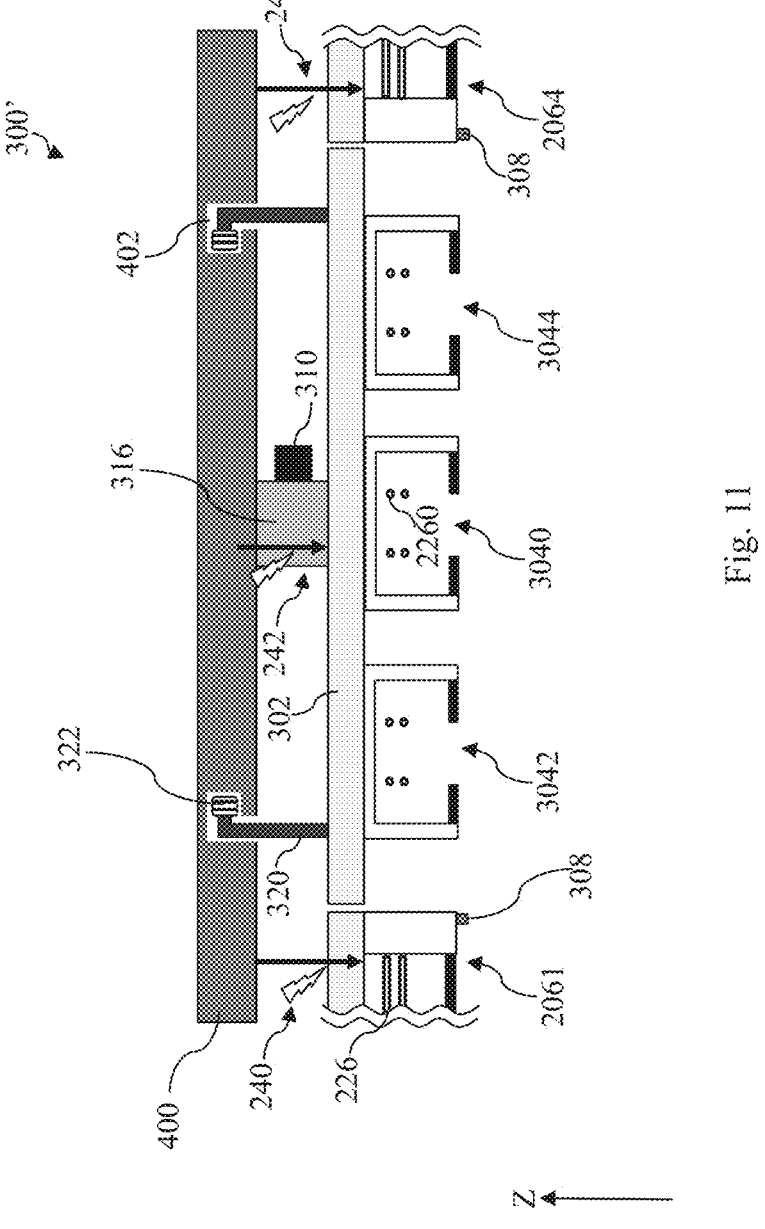
FIG. 11 is a schematic cross-sectional view of a second type turntable having position sensors at a second location, according to one or more aspects of the present disclosure.

While the stationary sensors 308 and the non-stationary sensors 306 may be mechanically attached to the yokes of the stationary rail branches or non-stationary rails, they may be mechanically attached to a bottom surface of the rail members 220. Referring to FIG. 10, the stationary sensors 308 are mechanically attached to a bottom surface of rail members 220 of the first interbay rail branch 2061 and the fourth interbay rail branch 2064. The non-stationary sensors 306 (shown in FIG. 6, not shown in the cross-sectional view in FIG. 11) are mechanically attached to a bottom surface of rail members 220 of the first non-stationary rail 3040, the second non-stationary rail 3042 an the third non-stationary rail 3044.

It is noted that while FIGS. 5, 6, 9 and 11 illustrate implementation of a first turntable 300 or a second turntable 300' in an interbay OHT system 132, the first turntable 300 or the second turntable 300' may also be implemented in an intrabay OHT system 134.

Figures 12, 13, 14, 15:
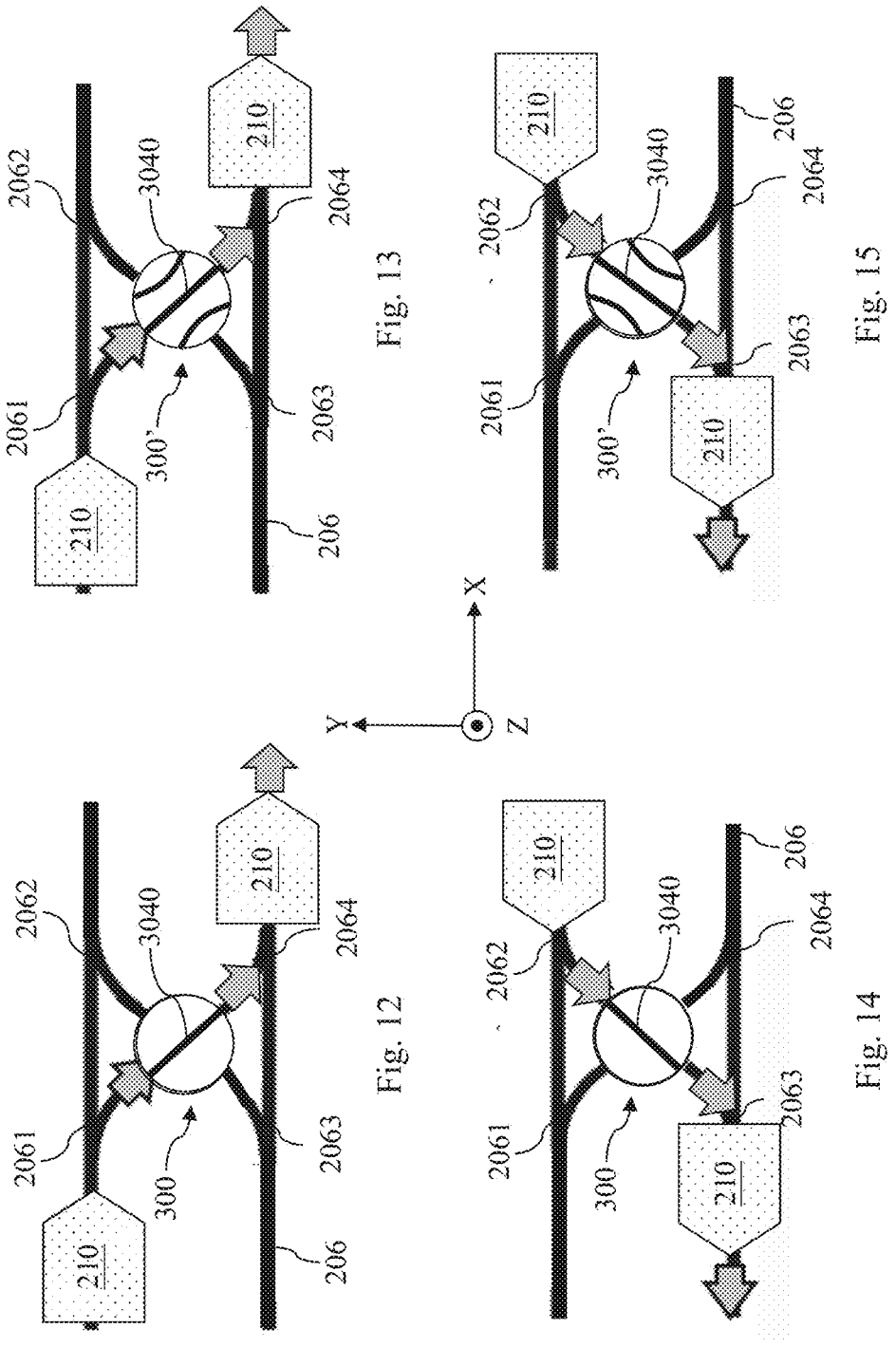
FIGS. 12-23 are schematic top views of a first type turntable or a second type turntable in different modes of operation, according to one or more aspects of the present disclosure.

FIGS. 12-23 are schematic top views of the first turntable 300 and the second turntable 300' in different modes of operation. In FIG. 12, the rotatable plate 302 of the first turntable 300 rotates to a position such that the first non-stationary rail 3040 is aligned with the first interbay rail branch 2061 and the fourth interbay rail branch 2064. As shown in FIG. 12, OHT vehicles 210 may travel from the first interbay rail branch 2061 to the first non-stationary rail 3040 and then to the fourth interbay rail branch 2064. When OHT vehicles 210 are travelling on the first non-stationary rail 3040, the OHT vehicles 210 are powered by a power source different from that for the first interbay rail branch 2061 or the fourth interbay rail branch 2064. In FIG. 13, the rotatable plate 302 of the second turntable 300' rotates to a position such that the first non-stationary rail 3040 is aligned with the first interbay rail branch 2061 and the fourth interbay rail branch 2064. As shown in FIG. 13, OHT vehicles 210 may travel from the first interbay rail branch 2061 to the first non-stationary rail 3040 and then to the fourth interbay rail branch 2064. The second non-stationary rail 3042 and the third non-stationary rail 3044 remain unused. When OHT vehicles 210 are travelling on the first non-stationary rail 3040, the OHT vehicles 210 are powered by a power source different from that for the first interbay rail branch 2061 or the fourth interbay rail branch 2064.

In FIG. 14, the rotatable plate 302 of the first turntable 300 rotates to a position such that the first non-stationary rail 3040 is aligned with the third interbay rail branch 2063 and the second interbay rail branch 2062. As shown in FIG. 14, OHT vehicles 210 may travel from the second interbay rail branch 2062 to the first non-stationary rail 3040 and then to the third interbay rail branch 2063. When OHT vehicles 210 are travelling on the first non-stationary rail 3040, the OHT vehicles 210 are powered by a power source different from that for the second interbay rail branch 2062 or the third interbay rail branch 2063. In FIG. 15, the rotatable plate 302 of the second turntable 300' rotates to a position such that the first non-stationary rail 3040 is aligned with the second interbay rail branch 2062 and the third interbay rail branch 2063. As shown in FIG. 15, OHT vehicles 210 may travel from the second interbay rail branch 2062 to the first non-stationary rail 3040 and then to the third interbay rail branch 2063. The second non-stationary rail 3042 and the third non-stationary rail 3044 remain unused. When OHT vehicles 210 are travelling on the first non-stationary rail 3040, the OHT vehicles 210 are powered by a power source different from that for the second interbay rail branch 2062 or the third interbay rail branch 2063.

The rotational position illustrated in FIG. 12, 13, 14, or 15 may be referred to as a rail transfer position of the first turntable 300 or the second turntable 300'.

Figures 16, 17, 18, 19:
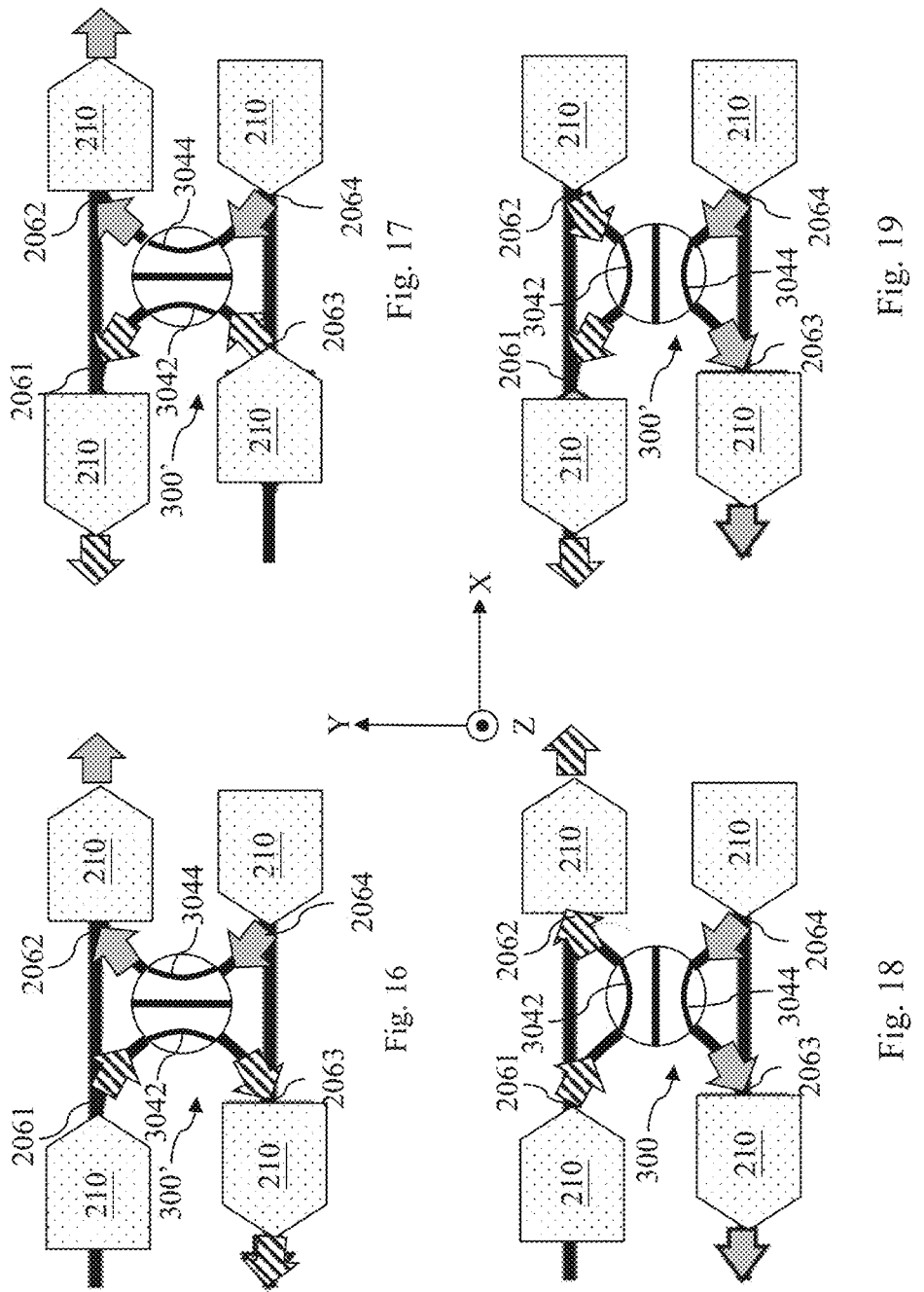
Figures 20, 21, 22, 23:
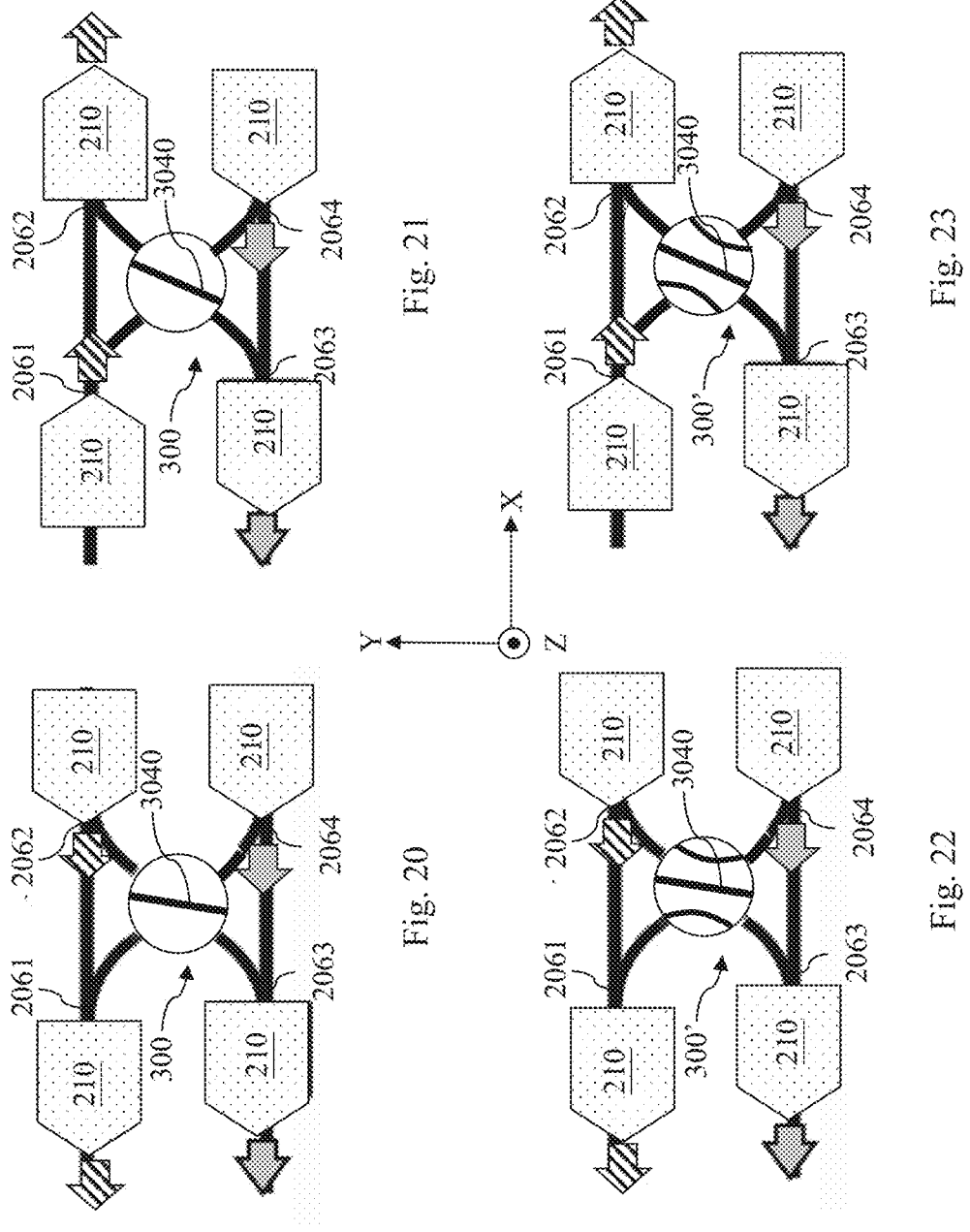

In FIGS. 16 and 17, the rotatable plate 302 of the second turntable 300' rotates to a position such that one end of the second non-stationary rail 3042 is aligned with the first interbay rail branch 2061 and the other end of the second non-stationary rail 3042 is aligned with the third interbay rail branch 2063. At that position, one end of the third non-stationary rail 3044 is aligned with the second interbay rail branch 2062 and the other end of the third non-stationary rail 3044 is aligned with the fourth interbay rail branch 2064. The first non-stationary rail 3040 remains unused. As shown in FIGS. 16 and 17, OHT vehicles 210 may travel from the first interbay rail branch 2061 to the second non-stationary rail 3042 and then to the third interbay rail branch 2063 or in a reverse order. Similarly, OHT vehicles 210 may travel from the second interbay rail branch 2062 to the third non-stationary rail 3044 and then to the fourth interbay rail branch 2064 or in a reverse order. It can be seen that the OHT vehicles 210 turn around to travel to an opposite direction by way of the second non-stationary rail 3042. When OHT vehicles 210 are travelling on the second non-stationary rail 3042, the OHT vehicles 210 are powered by a power source different from that for the first interbay rail branch 2061 or the third interbay rail branch 2063. The rotational position illustrated in FIG. 16 or 17 may be referred to as a turnaround position of the second turntable 300'.

In FIGS. 18 and 19, the rotatable plate 302 of the second turntable 300' rotates to a position such that one end of the second non-stationary rail 3042 is aligned with the first interbay rail branch 2061 and the other end of the second non-stationary rail 3042 is aligned with the second interbay rail branch 2062. At that position, one end of the third non-stationary rail 3044 is aligned with the third interbay rail branch 2063 and the other end of the second non-stationary rail 3042 is aligned with the fourth interbay rail branch 2064. The first non-stationary rail 3040 remains unused. As shown in FIGS. 18 and 19, OHT vehicles 210 travel from the first interbay rail branch 2061, the second interbay rail branch 2062, the third interbay rail branch 2063, or the fourth interbay rail branch 2064 may use the second non-stationary rail 3042 or the third non-stationary rail 3044 as a passing bay. When used this way, the Interbay OHT controller 122 in FIG. 1 (or the Intrabay OHT controller 124) may direct a low-priority OHT vehicle 210 to park in the second non-stationary rail 3042 or the third non-stationary rail 3044 so as to allow a high-priority OHT vehicle 210 to pass ahead. Once the high-priority OHT vehicle 210 has passed, the Interbay OHT controller 122 (or the Intrabay OHT controller 124) may release the low-priority OHT vehicle 210 from the second non-stationary rail 3042 or the third non-stationary rail 3044. The rotational position illustrated in FIG. 18 or 19 may be referred to as a passing bay position of the second turntable 300'.

In FIGS. 20, 21, 22, and 23, the rotatable plate 302 of the first turntable 300 or the second turntable 300' rotates to a position such that none of the non-stationary rail on the rotatable plate 302 is aligned with any of the interbay rail branches. The rotational position illustrated in FIG. 20, 21, 22, or 23 may be referred to as a no pass position of the first turntable 300 or the second turntable 300'.

It is noted that while FIGS. 12-23 illustrate implementation of a first turntable 300 or a second turntable 300' in an interbay OHT system 132, the first turntable 300 or the second turntable 300' may also be implemented in an intrabay OHT system 134.

FIG. 24 is a flowchart of a method 500 for using turntables of the present disclosure. In some embodiments, method 500 includes blocks 502, 504, 506, 508, 510, 512, 514, and 516. At block 502, a traffic pattern in a region of an automated material handling system (AMHS) 120 is analyzed. The region of the AMHS 120 includes a plurality of stationary (i.e. fixed) rail branches that are connectable to a turntable, such as the first turntable 300 or the second turntable 300'. For example, the interbay rail segment shown in FIG. 3 includes 4 parallel rails 206 that are parallel to one another. Block 502 monitors and analyzes the travelling directions and traffic on each of the 4 parallel interbay rails 206 before any changes are made to the region of the AMHS 120. At block 504, a request to change direction of traffic in the region is received. Using FIG. 3 as an example, the request at block 504 may include receiving a request to change OHT vehicle 210 traveling direction from the left-hand side to the right-hand side or vice versa. At block 506, rotation of the first turntable 300 or the second turntable 300' required to the requested change is identified. For example, the first turntable 300 or the second turntable 300' may need to rotate to a rail transfer position, a passing bay position, a turnaround position, or a no pass position. At block 508, movement of OHT vehicles 210 is stopped either on one of the non-stationary rails (or fixed rails) or on one of the stationary rails. When an OHT vehicle 210 is stopped on a curved non-stationary rail (e.g. the second non-stationary rail 3042 or the third non-stationary rail 3044), the first turntable 300 or the second turntable 300' may be functioning as a passing bay.

At block 510, the first turntables 300 or the second turntables 300' rotate the rotation needed to achieve the requested change. At block 512, the stationary sensors 308 and the non-stationary sensors 306 check whether the rails or rail branches are aligned with the first turntable 300 or the second turntable 300'. When they are aligned, method 500 proceeds to block 514 where the OHT vehicles 210 stopped earlier are released or allowed to proceed now. When they are not aligned, method 500 includes a block 516 to troubleshoot and correct the misalignment. In some embodiments, the misalignment may be corrected by rotating the rotatable plate 302 back and forth within a set of degrees to allow re-alignment of the stationary sensors 308 and the non-stationary sensors 306. Once the alignment is achieved, the OHT vehicles 210 are released onto the stationary rails.

Although not intended to be limiting, one or more embodiments of the present disclosure provide many benefits. For example, the present disclosure provide a turntable that includes at least one non-stationary rail to rotate into and out of alignment with multiple stationary rail branches. The turntable may function as a rail joint, a turnaround track, or passing bay. When functioning as a rail joint, the turntable may allow OHT vehicles to change tracks while keeping the same travelling direction. When functioning as a turnaround track, the turntable allows OHT vehicles traveling on one track to turn around onto an adjacent track. When functioning as a passing bay, the turntable may hold and keep a low-priority OHT vehicle while allowing a high-priority OHT vehicle to pass ahead. In some instances, the turntable may also rotate to a no pass position where no OHT vehicles are allowed to travel onto the at least one non-stationary rail on the turntable. The turntable therefore provides more flexibility in route planning. This added flexibility enables a real-time dispatching system (RTD) to provide more efficient and time-saving routes for wafer transportation.

In one aspect of the present disclosure, an apparatus is provided. The apparatus includes a hanger feature configured to be hung from a ceiling, a plate-like structure having a top surface and a bottom surface, the top surface being rotatably coupled to the hanger feature, and at least one pair of rail members mechanically coupled to the bottom surface of the plate-like structure by way of a plurality of yoke members.

In some embodiments, the plate-like structure includes a circular shape from a top view. In some implementations, the at least one pair of rail members includes a diameter pair of rail members extending along a diameter of the plate-like structure. In some instances, the at least one pair of rail members further includes two curved pairs of rail members that are mirror image of one another with respect to the diameter pair of rail members. In some embodiments, the apparatus further includes a position sensor disposed on at least one of the plurality of yoke members. In some instances, the apparatus further includes a position sensor mechanically attached to the at least one pair of rail members. In some embodiments, the apparatus further includes a least a pair of cables extending along substantially an entire length of the at least one pair of rail members.

In another aspect of the present disclosure, a system is provided. The system includes a first fixed rail segment, a second fixed rail segment aligned with the first fixed rail segment along a first direction, a rotatable rail joint disposed between the first fixed rail segment and the second fixed rail segment along the first direction, a hanger mechanically coupled to the rotatable rail joint, and a powered rotational mechanism housed in the hanger. The rotatable rail joint includes at least one rotational rail that is aligned with the first fixed rail segment and the second fixed rail segment when the rotatable rail joint rotates to an alignment position and is not aligned with the first fixed rail segment and the second fixed rail segment when the rotatable rail joint rotates out of the alignment position.

In some embodiments, the powered rotational mechanism includes an electric motor. In some embodiments, the first fixed rail segment includes a first pair of power cables, the second fixed rail segment includes a second pair of power cables, the at least one rotational rail includes a third pair of power cables, the first pair of power cables and the second pair of power cables are powered by a first power source, and the third pair of power cables are powered by a second power source different from the first power source. In some embodiments, the system further includes a vehicle that includes at least one wheel to engage the first fixed rail segment, the second fixed rail segment, and the at least one rotational rail, and a first core block and a second core block configured to inductively engage the first pair of power cables, the second pair of power cables, and the third pair of power cables. In some implementations, each of the first core block and the second core block is U-shaped and a pickup coil is wound around a portion of the first core block and a portion of the second core block. In some embodiments, the rotatable rail joint includes a circular shape and the at least one rotational track includes a straight rail that extends along a diameter of the rotatable rail joint to divide the rotatable rail joint into a first half and a second half, a first curved rail disposed on the first half of the rotatable rail joint, and a second curved rail disposed on the second half of the rotatable rail joint. In some embodiments, the system further includes a third fixed rail segment and a fourth fixed rail segment aligned with the third fixed rail segment along a second direction different from the first direction. The rotatable rail joint is disposed between the third fixed rail segment and the fourth fixed rail segment along the second direction. In some embodiments, the system further includes a first sensor attached to the first fixed rail segment, a second sensor attached to the second fixed rail segment, and a third sensor attached to the third fixed rail segment. The first sensor and the third sensor detect whether the first fixed rail segment and the third fixed rail segment are aligned and the second sensor and the third sensor detect whether the second fixed rail segment and the third fixed rail segment are aligned.

In yet another aspect of the present disclosure, a method is provided. The method includes analyzing a traffic pattern of a transport system that includes a first fixed rail segment, a second fixed rail segment, a third fixed rail segment, a fourth fixed rail segment, a rotatable rail joint disposed between the first fixed rail segment and the second fixed rail segment along a first direction as well as between the third fixed rail segment and the fourth fixed rail segment along a second direction different from the first direction, the rotatable rail joint includes a rotational track, and a plurality of vehicles, each of the plurality of vehicles being configured to ride on the first fixed rail segment, the second fixed rail segment, the third fixed rail segment, the fourth fixed rail segment, or the rotational track, identifying a rotational position of the rotatable rail joint to achieve a change in a traffic pattern in the transport system, stopping a vehicle riding on one of the first fixed rail segment, the second fixed rail segment, the third fixed rail segment, the fourth fixed rail segment, and rotating the rotatable rail joint such that the rotational track is aligned with the first direction.

In some embodiments, the transport system further includes a plurality of position sensors to determine if the rotational track is aligned with the first direction or the second direction. In some instances, the method further includes after the rotational track is aligned with the first direction, releasing the stopped vehicle onto the rotational track. In some implementation, the method further includes rotating the rotatable rail joint such that the rotational track is aligned with the second direction. In some instances, the method further includes, after the rotational track is aligned with the second direction, releasing the stopped vehicle onto the rotational track.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. It is understood that various different combinations of the above-listed processing steps can be used in combination or in parallel. Also, features illustrated and discussed above with respect to some embodiments can be combined with features illustrated and discussed above with respect to other embodiments. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An overhead transport turntable system, comprising:
a first fixed rail segment;
a second fixed rail segment aligned with the first fixed rail segment along a first direction;
a rotatable rail joint disposed between the first fixed rail segment and the second fixed rail segment along the first direction;
a hanger mechanically coupled to the rotatable rail joint; and
a powered rotational mechanism housed in the hanger,
wherein the rotatable rail joint comprises at least one rotational rail that is aligned with the first fixed rail segment and the second fixed rail segment when the rotatable rail joint rotates to an alignment position, and is not aligned with the first fixed rail segment and the second fixed rail segment when the rotatable rail joint rotates out of the alignment position,
wherein the at least one rotational rail is attached to a bottom side of the rotatable rail joint,
wherein at least one support member is attached to a top side of the rotatable rail joint, and
wherein the at least one support member comprises a set of support wheels.

2. The system of claim 1, wherein the powered rotational mechanism comprises an electric motor.

3. The system of claim 1,
wherein the first fixed rail segment comprises a first pair of power cables,
wherein the second fixed rail segment comprises a second pair of power cables,
wherein the at least one rotational rail comprises a third pair of power cables,
wherein the first pair of power cables and the second pair of power cables are powered by a first power source,
wherein the third pair of power cables are powered by a second power source different from the first power source.

4. The system of claim 3, further comprising a vehicle that includes:

at least one wheel to engage the first fixed rail segment, the second fixed rail segment, and the at least one rotational rail; and
a first core block and a second core block configured to inductively engage the first pair of power cables, the second pair of power cables, and the third pair of power cables.

5. The system of claim 4,
wherein each of the first core block and the second core block is U-shaped,
wherein a pickup coil is wound around a portion of the first core block and a portion of the second core block.

6. The system of claim 1,
wherein the rotatable rail joint comprises a circular shape,
wherein the at least one rotational rail comprises:
a straight rail that extends along a diameter of the rotatable rail joint to divide the rotatable rail joint into a first half and a second half;
a first curved rail disposed on the first half of the rotatable rail joint; and
a second curved rail disposed on the second half of the rotatable rail joint.

7. The system of claim 1, further comprising:
a third fixed rail segment; and
a fourth fixed rail segment aligned with the third fixed rail segment along a second direction different from the first direction,
wherein the rotatable rail joint is disposed between the third fixed rail segment and the fourth fixed rail segment along the second direction.

8. The system of claim 7, further comprising:
a first sensor attached to the first fixed rail segment;
a second sensor attached to the second fixed rail segment; and
a third sensor attached to the rotatable rail joint,
wherein the first sensor and the third sensor detect whether the first fixed rail segment and the at least one rotational rail are aligned,
wherein the second sensor and the third sensor detect whether the second fixed rail segment and the at least one rotational rail are aligned.

9. An overhead transport turntable system, comprising:
a first interbay rail and a second interbay rail extending parallel with one another;
a first rail branch stemming from the first interbay rail;
a second rail branch stemming from the second interbay rail and aligned with and spaced apart from the first rail branch along a first direction;
a third rail branch stemming from the first interbay rail;
a fourth rail branch stemming from the second interbay rail and aligned with and spaced apart from the third rail branch along a second direction different from the first direction;
a circular turntable disposed between the first rail branch and the second rail branch along the first direction and between the third rail branch and the fourth rail branch along the second direction, the circular turntable comprising a nonstationary rail branch extending along a diameter of the circular turntable; and
a hanger mechanically coupled to the circular turntable,
wherein the circular turntable is disposed between the first interbay rail and the second interbay rail along a third direction different from the first direction and the second direction,
wherein the circular turntable is configured to rotate around the hanger, wherein the circular turntable comprises a first rotational position where the nonstationary rail branch is aligned with the first rail branch and the second rail branch, wherein the circular turntable comprises a second rotational position where the nonstationary rail branch is aligned with the third rail branch and the fourth rail branch.

10. The system of claim 9, wherein each of the first rail branch, the second rail branch, the third rail branch, and the fourth rail branch comprises two rail members.

11. The system of claim 9, wherein the circular turntable further comprises a first curved nonstationary rail branch and a second curved nonstationary rail branch, wherein the nonstationary rail branch is disposed between the first curved nonstationary rail branch and the second curved nonstationary rail branch.

12. The system of claim 11, wherein the circular turntable comprises a third rotational position where the first curved nonstationary rail branch connects the first rail branch and the third rail branch and the second curved nonstationary rail branch connects with second rail branch and the fourth rail branch.

13. The system of claim 12, wherein, at the third rotational position, the nonstationary rail branch is not aligned with any of the first rail branch, the second rail branch, the third rail branch, and the fourth rail branch.

14. The system of claim 9, wherein the first rail branch comprises a first pair of power cables, wherein the second rail branch comprises a second pair of power cables, wherein the nonstationary rail branch comprises a third pair of power cables, wherein the first pair of power cables and the second pair of power cables are powered by a first power source, wherein the third pair of power cables are powered by a second power source different from the first power source.

15. The system of claim 14, further comprising a vehicle that includes:

at least one wheel to engage the first rail branch, the second rail branch, and the nonstationary rail branch; and a first core block and a second core block configured to inductively engage the first pair of power cables, the second pair of power cables, and the third pair of power cables.

16. The system of claim 15, wherein each of the first core block and the second core block is U-shaped, wherein a pickup coil is wound around a portion of the first core block and a portion of the second core block.

17. The system of claim 9, further comprising:

a first sensor attached to the first rail branch;

a second sensor attached to the third rail branch; and a third sensor attached to the circular turntable adjacent to the nonstationary rail branch, wherein the first sensor and the third sensor detect whether the first rail branch and the nonstationary rail branch are aligned, wherein the second sensor and the third sensor detect whether the third rail branch and the nonstationary rail branch are aligned.

18. An overhead transport turntable system, comprising:

a first rail branch;

a second rail branch aligned with and spaced apart from the first rail branch along a first direction;

a third rail branch;

a fourth rail branch aligned with and spaced apart from the third rail branch along a second direction different from the first direction;

a circular turntable disposed between the first rail branch and the second rail branch along the first direction and between the third rail branch and the fourth rail branch along the second direction, the circular turntable comprising a nonstationary rail branch extending along a diameter of the circular turntable;

a hanger mechanically coupled to the circular turntable;

a first sensor attached to the first rail branch;

a second sensor attached to the third rail branch; and a third sensor attached to the circular turntable adjacent to the nonstationary rail branch, wherein the circular turntable is configured to rotate around the hanger, wherein the circular turntable comprises a first rotational position where the nonstationary rail branch is aligned with the first rail branch and the second rail branch, wherein the circular turntable comprises a second rotational position where the nonstationary rail branch is aligned with the third rail branch and the fourth rail branch, wherein the first sensor and the third sensor detect whether the first rail branch and the nonstationary rail branch are aligned, wherein the second sensor and the third sensor detect whether the third rail branch and the nonstationary rail branch are aligned, wherein the nonstationary rail branch is attached to a bottom side of the circular turntable, wherein at least one support member is attached to a top side of the circular turntable, and wherein the at least one support member comprises a set of support wheels.

19. The system of claim 18, wherein the circular turntable further comprises a first curved nonstationary rail branch and a second curved nonstationary rail branch, wherein the nonstationary rail branch is disposed between the first curved nonstationary rail branch and the second curved nonstationary rail branch.

20. The system of claim 19, wherein the circular turntable comprises a third rotational position where the first curved nonstationary rail branch connects the first rail branch and the third rail branch and the second curved nonstationary rail branch connects with second rail branch and the fourth rail branch.

* * * * *